United States Patent [19]

Halder

[11] Patent Number: 4,594,547
[45] Date of Patent: Jun. 10, 1986

[54] MARK-SPACE AMPLITUDE MODULATOR FOR MEASURING REACTIVE POWER CONSUMPTION OR REACTIVE ENERGY CONSUMPTION

[75] Inventor: Mathis Halder, Baar, Switzerland

[73] Assignee: LGZ Landis & Gyr Zug AG, Zug, Switzerland

[21] Appl. No.: 554,599

[22] Filed: Nov. 23, 1983

[30] Foreign Application Priority Data

Nov. 30, 1982 [CH] Switzerland .................. 6962/82

[51] Int. Cl.[4] .................. G01R 21/06; G01R 21/133
[52] U.S. Cl. .................. 324/141; 307/262; 307/512; 364/703; 364/842
[58] Field of Search ......... 364/483, 841, 703, 842; 324/141, 142; 307/510, 511, 512, 262, 513, 514, 515, 516; 331/27, 1 A; 375/118, 119, 120; 328/155

[56] References Cited

U.S. PATENT DOCUMENTS

| | | | |
|---|---|---|---|
| 3,626,308 | 12/1971 | Paine | 307/512 |
| 3,849,671 | 11/1974 | Molack | 307/511 |
| 3,983,498 | 9/1976 | Malek | 331/1 A X |
| 4,166,249 | 8/1979 | Lynch | 331/1 A X |
| 4,363,002 | 12/1982 | Fuller | 331/1 A |
| 4,404,428 | 9/1983 | Hirata et al. | 307/512 |
| 4,408,283 | 10/1983 | Kovalchik et al. | 364/483 |

FOREIGN PATENT DOCUMENTS 3205840  1/1983  Fed. Rep. of Germany ...... 364/483
56-112656 9/1981 Japan .................. 324/142
3121448  5/1982  Japan .

OTHER PUBLICATIONS

Uzunoglu, V., "Build a Linear-IC Phase-Locked Loop", Electronic Design, vol. 10, May 9, 1968, pp. 90–93.

Primary Examiner—Jerry W. Myracle
Assistant Examiner—Stephen M. Baker
Attorney, Agent, or Firm—Marmorek Guttman & Rubenstein

[57] ABSTRACT

An apparatus for determining the reactive energy of a circuit includes a mark-space modulator, which has an input terminal normally accepting a first signal input, and an output terminal, a pulse amplitude modulator which has a bipolar modulating terminal normally accepting a second and bipolar signal input, a signal output terminal, and a pulse input terminal, and a delay circuit which has a data input terminal connected to the output terminal of the mark space modulator, and which has an output terminal connected to the pulse input terminal of the pulse amplitude modulator. A predetermined phase angle at an operating frequency of the delay circuit normally occurs between the input terminal and the output terminal of the delay circuit. A regulator is interconnected between the mark-space modulator and the delay circuit so as to maintain the phase angle at the operative frequency as close as possible to 90 degrees, even when the signal input is subject to any level variations or to any interference.

6 Claims, 8 Drawing Figures

MARK-SPACE AMPLITUDE MODULATOR FOR MEASURING REACTIVE POWER CONSUMPTION OR REACTIVE ENERGY CONSUMPTION

FIELD OF THE INVENTION

The present invention relates to a Mark-Space amplitude modulator for measuring reactive power consumption or reactive energy consumption.

DESCRIPTION OF THE PRIOR ART

A Mark-Space amplitude modulator of this kind is known from the German Offenlegungsschrift OS No. 32 21 448, FIG. 13.

SUMMARY OF THE INVENTION

It is an object of the present invention to create a Mark-Space amplitude modulator for measuring reactive power consumption or reactive energy consumption whose 90° phase shift circuit operates properly even when input valves to be measured are subject to large and unknown level variations or interferences or both, such as noise, mains harmonics or switching spikes.

This object is attained in an apparatus of the aforedescribed kind for determining the reactive energy of a circuit, by providing a mark-space modulator, a pulse amplitude modulator, and a delay circuit connected between the mark-space modulator and the pulse amplitude modulator. A regulator is interconnected between the mark-space modulator and the delay circuit, so as to maintain a phase angle, which normally occurs at an operating frequency of the delay circuit, as close as possible to 90 degrees between its input and its output, even when the signal input is subject to any level variations or to any interference.

DESCRIPTION OF THE DRAWINGS

A representative embodiment of the invention is shown in the drawings and is described in detail hereinafter, and wherein.

The same reference numbers designate the same components in all Figures of the drawings.

DESCRIPTION OF THE PREFERRED EMBODIMENTS

Figure 1:
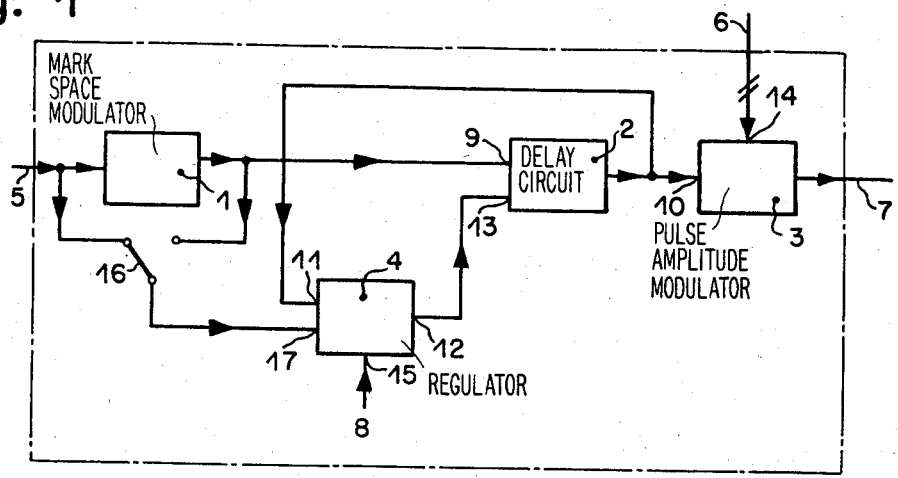
FIG. 1 is a block diagram of a Mark-Space amplitude modulator.

The Mark-Space amplitude modulator according to FIG. 1 includes:
a mark-space modulator 1,
a delay circuit 2,
a first pulse amplitude modulator 3,
a regulator 4,
a first input signal terminal 5,
a bipolar second input signal terminal 6,
an output signal terminal 7, and
an input terminal for a clock signal 8.

The Mark-Space amplitude modulator has two terminals hereinafter designated as an input terminal and as an output terminal.

In FIG. 1, connections are established:
between the first input signal terminal 5 of the Mark-Space amplitude modulator and the input terminal of the mark-space modulator 1,
between the output terminal of the mark-space modulator 1 and a data input terminal 9 of delay circuit 2,
between the output terminal of the delay circuit 2 and a pulse input terminal 10 of a first pulse amplitude modulator 3, as well as a first signal input terminal 11 of a regulating means 4,
between the output terminal 12 of the regulating means, or regulator 4, and a clock input terminal 13 of the delay circuit 2,
between the bipolar second input signal terminal 6 of the Mark-Space amplitude modulator and a bipolar modulating input terminal 14 of the first pulse amplitude modulator 3,
between the output terminal of the pulse amplitude modulator 3 and an output signal terminal 7 of the Mark-Space amplitude modulator,
between a clock signal terminal 8 and a clock input terminal 15 of the regulator 4, and
by means of a wire connection 16, between a second input signal terminal 17 of the regulator 4 and one of the two terminals of the mark-space modulator 1.

The wire connection 16 schematically indicates that the second signal terminal 17 of the regulator 4 is optionally connected to either one or the other of the two terminals of the mark-space modulator 1. The wire connection need not in reality be present, since the choice of connections is unambiguously determined by the chosen design of the regulator. Once the design is given, the choice of connections is determined and a hard-wired connection can be made between this terminal and the second input signal terminal 17 of regulator 4.

Figure 2:
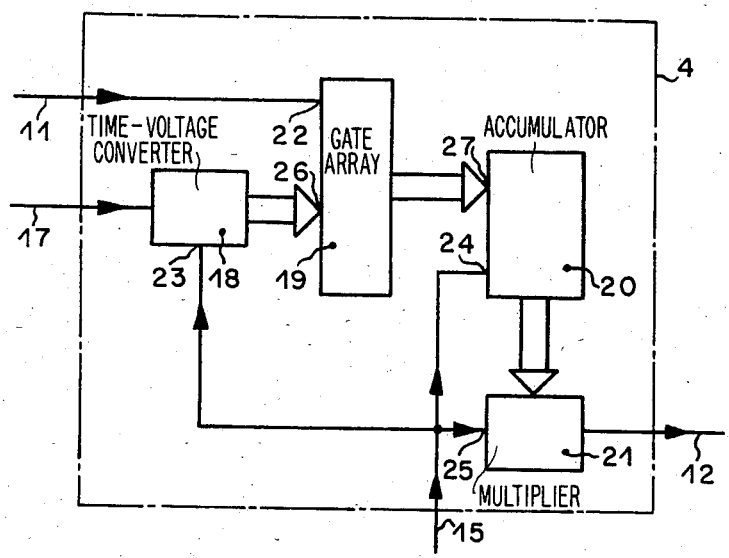
FIG. 2 is a block diagram of a first version of a regulator.

The regulator 4 shown in FIG. 2 includes:
a time-voltage converter 18,
an exclusive or gate array 19,
an accumulator 20, and
a rate multiplier 21.

In FIG. 2 connections are established:
between the first input signal terminal 11 of the regulator 4 and a common unipolar input terminal 22 of the exclusive or gate array 19:
between the second input signal terminal 17 of the regulator 4 and the input signal terminal of the time-voltage converter 18;
between the clock input terminal 15 of the regulator 4 and the clock input terminals 23 of the time-voltage converter 18, 24 of the accumulator 20 and 25 of the rate multiplier 21;
between the output terminal of the rate multiplier 21 and the output terminal 12 of the regulator 4;
and additionally bus connections are established:
between the bus output terminal of the time-voltage converter 18 and the bus input terminal 26 of the exclusive or gate array 19;

between the bus output terminal of the exclusive or gate
   array 19 and the bus input terminal 27 of the accumulator 20; and
between the bus output terminal of the accumulator 20
   and the parallel-in bus input terminal of the rate multiplier 21.

If necessary, a further delay circuit not shown in the drawings may be inserted in the regulator 4 between the first input signal terminal 11 and the common input terminal 22 of the exclusive or gate array 19 for compensation of any additional delay times generated in the time-voltage converter 18.

Figure 3:
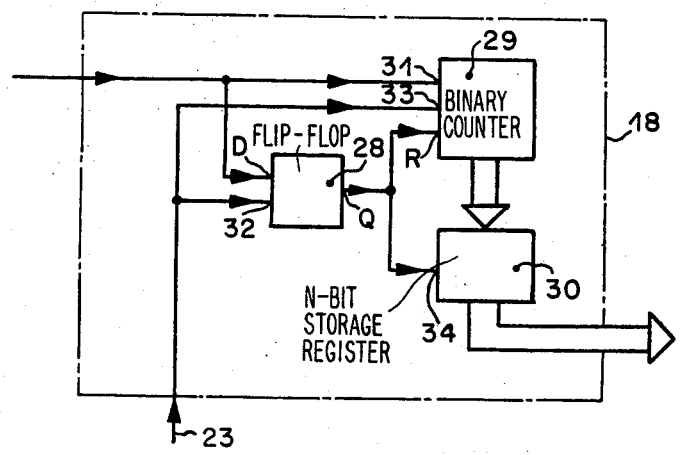
FIG. 3 is a block diagram of a time-voltage converter.

The time-voltage converter 18 shown in FIG. 3 includes:
a synchronizing D-flip flop 28,
a binary counter 29, and
an N-bit intermediate storage register 30.

In FIG. 3 connections are established:
between the input signal terminal of the time-voltage converter 18 and the D-input terminal of the synchronizing D-flip flop 28, as well as the forward/backward counting input terminal 31 of the binary counter 29;
between the clock input terminal 23 of the time-voltage converter 18 and the clock input terminals
32 of the synchronizing D-flip flop 28 and
33 of the binary counter 29;
between the Q-output terminal of the synchronizing D-flip flop 28 and the reset input terminal R of the binary counter 29, as well as the clock input terminal 34 of the intermediate storage register 30.

Additionally, bus connections are established:
between the bus output terminal of the binary counter 29 and the bus input terminal of the intermediate storage register 30; and
between the bus output terminal of the storage register 30 and the bus output terminal of the time-voltage converter 18.

Figure 4:
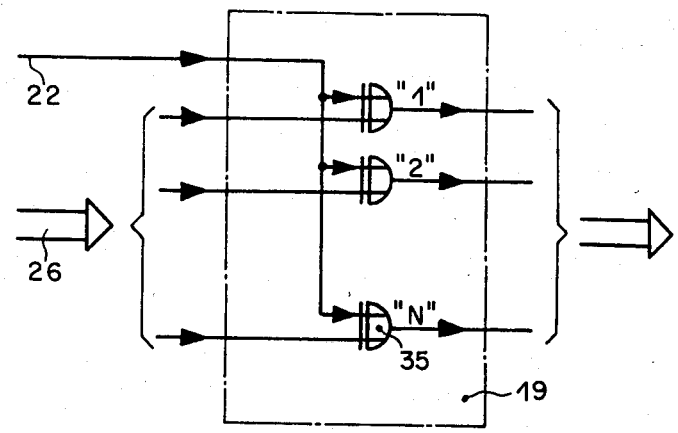
FIG. 4 is a logic diagram of an exclusive or logic gate array.

The exclusive or gate array 19 shown in FIG. 4 includes N two-input exclusive or gates 35. The first input terminal of each exclusive or gate 35 is connected to a common unipolar input terminal 22 of array 19. The N second input terminals of the exclusive or gates 35 form in combination an N-bit bus input terminal which is connected to the bus input terminal 26 of the array 19. In a like manner, the N output terminals of exclusive or gates 35 form an N-bit bus output terminal connected to the N-bit bus output terminal of the array 19.

Figure 5:
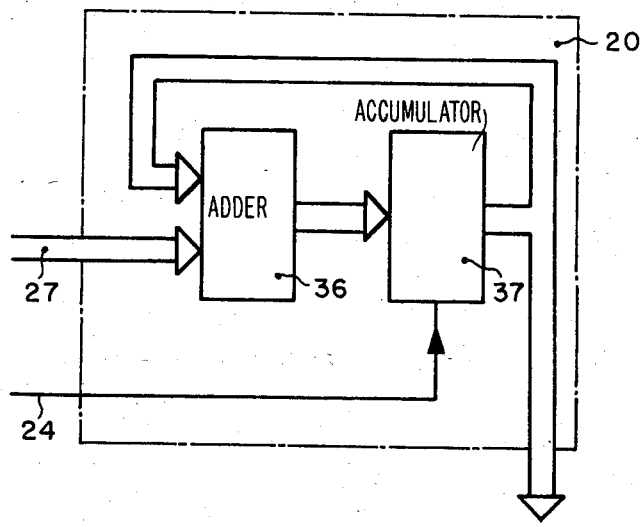
FIG. 5 is a block diagram of an accumulator.

Accumulator 20 shown in FIG. 5 includes:
an adder, 36, and
an N-bit accumulator storage register 37.

In FIG. 5, an N-bit bus connection is established:
between the bus input terminal 27 of the accumulator 20 and a first N-bit bus input terminal of the adder 37;
between the bus output terminal of the adder 36 and the bus input terminal of the accumulator storage register 37;
between the bus output terminal of the accumulator storage register 37 and a second N-bit bus input terminal of the adder 36 as well as the bus output terminal of the accumulator 20;
and a unipolar connection is established:
between the clock input terminal 24 of the accumulator 20 and the clock input terminal of the accumulator storage register 37.

Figure 6:
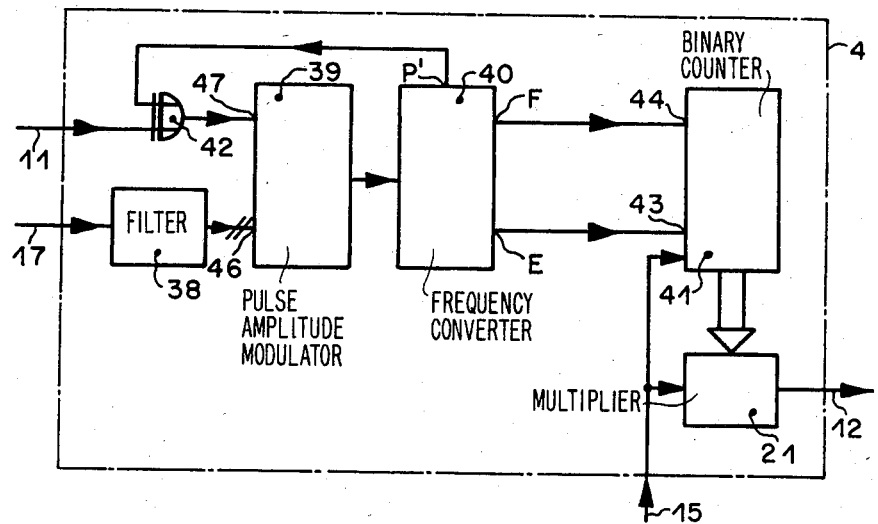
FIG. 6 is a block diagram of a second version of a regulator.

The regulator 4 shown in FIG. 6 includes:
a filter 38,
a second pulse amplitude modulator 39,
a frequency converter 40,
a forward/backward binary counter 41,
an exclusive or gate 42, and
a rate multiplier 21.

In FIG. 6, connections are established:
between the first signal input terminal 11 of the regulator 4, and a first input terminal of the exclusive or gate 42;
between the output terminal of the exclusive or gate 42 and the pulse input terminal 47 of the second pulse amplitude modulator 39;
between the second signal input terminal 17 of the regulator 4 and the input terminal of the filter 38;
between a bipolar output terminal of the filter 38 and a bipolar modulting input terminal 46 of the second pulse amplitude modulator 39;
between the output terminal of the second pulse amplitude modulator 39 and the input terminal of the frequency converter 40;
between the polarity signal output terminal P' of the frequency converter 40 and a second input terminal of the exclusive or gate 42;
between a direction signal output terminal E of the frequency converter 40 and a forward/backward input counting terminal 43 of the forward/backward binary counter 41;
between a measurement signal output terminal F of the frequency converter 40 and a clock input terminal 44 of the forward/backward binary counter 41;
between a clock input terminal 15 of the regulator 4 and the clock input terminals of the forward/backward binary counter 41 and of the rate multiplier 21;
between the output terminal of the rate multiplier 21 and the output terminal 12 of the regulator 4; and:
a bus connection is also established between the parallel-out bus output terminal of the forward/backward binary counter 41 and the parallel-in bus input terminal of the rate multiplier 21.

Figure 7:
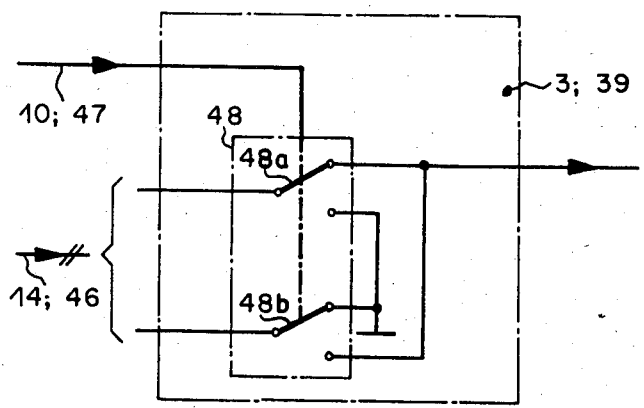
FIG. 7 is a circuit diagram of a pulse amplitude modulator.

The pulse amplitude modulator 3 or 39 shown in FIG. 7 includes a double-pole double-throw switch 48.

In FIG. 7, a connection is established between the pulse input terminal 10 or 47 of the pulse amplitude modulator 3 or 39 and a control input terminal of the switch 48.

A first switch-throw contact 48a of the switch 48 switches a first pole of the bipolar modulating input terminal 14 or 46 either to the unipolar output terminal of the pulse amplitude modulator 3 or 39, or to neutral ground, while its second switch throw-contact 48b switches a second pole of the modulating input terminal 14 or 46 either to neutral ground or to a unipolar output terminal of the pulse amplitude modulator 3 or 39.

Figure 8:
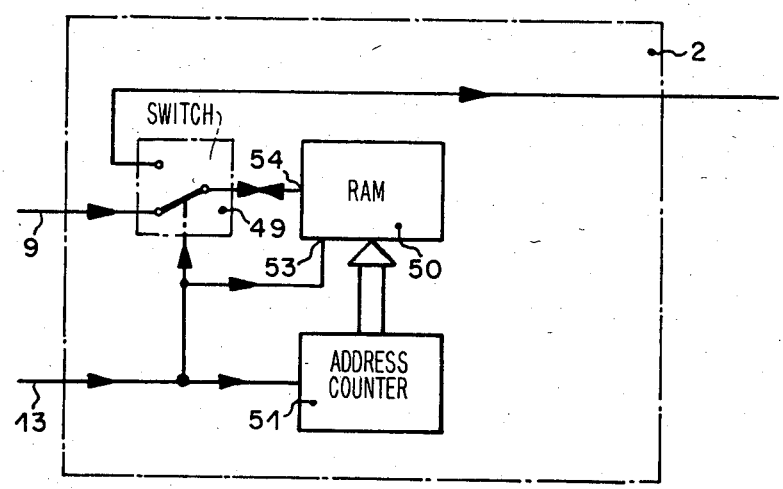
FIG. 8 is a block diagram of a delay circuit based upon a random access memory.

The delay circuit 2 shown in FIG. 8 includes:
a single-pole switch 49,
a random access memory 50,
a binary address counter 51, and
a D-flip flop 52.

In FIG. 8 connections are established:
between a clock input terminal 13 of the delay circuit 2 and the clock input terminal of binary address counter 51, as well as the control input terminal of single-pole switch 49 and read/write input terminal 53 of random access memory 50;
from the data-in/data-out terminal 54 of the random access memory 50, on the one hand via the normally closed and openable contact of the switch 49 to the data-in input terminal 9 of the delay circuit 2 and on the other hand via the normally open and closable contact of the switch 49 to the output terminal of the delay circuit 2; and:

a bus connection is also established between the parallel-out bus output terminal of the address counter 51 and the address bus input terminal of the random access memory 50.

OPERATION OF THE INVENTION

The use and design of a Mark-Space amplitude modulator for the multiplication of two values such as, for example, the current and potential of electrical supply mains, to determine power or energy consumption is known, for example, from U.S. Pat. No. 3,602,843.

It is also known that for determining the reactive power consumption or reactive energy consumption, one of the two values must be phase-shifted 90° before multiplication in order to simulate the equation:

$$u \cdot i(90°) = (U\cos\omega t) \cdot [I\cos(\omega t + \phi + 90°)], \quad (1)$$
$$= (U \cdot I/2)[\cos(\phi + 90°) + \cos(2\omega t + \phi + 90°)],$$
$$= -(UI/2)[\sin\phi + \sin(2\omega t + \phi)],$$
$$\cong -(UI/2)\sin\phi, \quad (2)$$
$$\cong k \cdot UI\sin\phi,$$
$$\cong k \cdot Q,$$

where the second time-dependent term $\sin(2\omega t + \phi)$ must be eliminated, for example, by integration, and where:

$u = U \cdot \cos \omega t$ is the instantaneous value of an AC voltage, $i = I \cdot \cos(\omega t + \phi)$ is the instantaneous value of an associated AC current phase-shifted by a phase angle $\phi$, $i(90°) = I \cdot \cos(\omega t + \phi + 90°)$ is the instantaneous value of the AC current phase-shifted by a supplementary 90°, $k = (-\frac{1}{2})$ is a constant, and $Q = U \cdot I \sin \phi$ is the reactive power.

It is known from the state of the art described above that the 90° phase shift need not necessarily take place before the multiplication, but may be effected by an equivalent time-delay shift within the Mark-Space amplitude modulator by means of a delay circuit 2 interposed between the mark-space modulator 1 and a subsequent pulse amplitude modulator 3.

In FIG. 1, the delay circuit 2 and the regulator 4 form a feedback regulation circuit so designed that in stable operation cos $\alpha = 0$, i.e. $\alpha = 90°$, where $\alpha$ is the phase angle between the output signal u'(90°) and the input signal u' of the delay circuit 2.

Both variations of the regulator 4 shown in FIGS. 2 and 6 made use of the following mathematical laws:

$$u' \cdot u'(\alpha) = U'\cos\omega t \cdot U'\cos(\omega t + \alpha), \quad (4)$$
$$= U'^2[\cos\alpha + \cos(2\omega t + \alpha)],$$
$$\cong U'^2\cos\alpha \quad (5)$$

where the second time-dependent term cos $(2 \omega t + \alpha)$ must again be eliminated by integration, for example by means of an accumulator 20 (FIG. 2) or by means of a forward/backward binary counter 41 (FIG. 6), and where:

$u' = U' \cos \omega t$ is the instantaneous value of the input signal of the delay circuit 2, and $u'(\alpha) = U' \cos (\omega t + \alpha)$ is the instantaneous value of the output signal of the delay circuit 2.

In the first version, the regulator 4 is designed according to FIG. 2 and the output signal of the mark-space modulator 1, which is also the input signal u' of the delay circuit 2, arrives at the second signal input terminal 17 of the regulator 4 in FIG. 1 by means of the wire connection 16. The output signal u'(α) is fed to first signal input terminal 11 of regulator 4.

u' constitutes a Mark-Space modulated signal and is reconverted into an amplitude modulated signal in regulator 4 (FIG. 2) by means of the time-voltage converter 18. The instantaneous values of the amplitude appear sequentially as N-bit digital balues at bus input terminal 26 of the exclusive or gate array 19, which operates as a multiplier yielding the mathematical product u'·u'(α). Since u'(α) is a digital mark-Space modulated signal, consisting only of the binary values "0" and "1", in order to perform the multiplication operation, it suffices to multiply each bit of the N-bit value at the bus input terminal 26 by the simultaneously appearing binary value of u'(α) by means of an exclusive or gate. In other words, the exclusive or gate array 19 consists of N exclusive or gates 35 interconnected according to the logic diagram of FIG. 4.

The N-bit digital result of the multiplication is integrated in the accumulator 20 to eliminate the cos (2ωt+α) term, as already mentioned above and the digital value of ($\int U'^2 \cos \alpha \, dt$) thus obtained is loaded into the rate multiplier 21 as the factor (m/n). The accumulator 20 consists principally of an accumulator storage register 37 in which the old multiplication result is stored and to which the new multiplication result is added, namely, accumulated by means of an adder 36.

In the second version of the invention, the regulator 4 is designed according to FIG. 6 and the input signal of the Mark-Space modulator 1 now arrives at second input signal terminal 17 of the regulator 4 (FIG. 1) by means of a wire connection 16, as well as via a filter 38 (FIG. 6) in bipolar form to a modulating input 46 of a second pulse amplitude modulator 39. The design of both pulse amplitude modulators 3 and 39 is identical, and is known per se. It is shown again in FIG. 7 for sake of completeness only. It consists of a double-pole switch 48 which operates at the clocking rate of the binary signal appearing at the pulse input 10 or 47, so that the bipolar signal at the modulating input 14 or 46 appears at the output terminal of the pulse amplitude modulator 3 or 39 once inverted, and once non-inverted at the same clocking rate. This switch therefore constitutes a double-throw switch and operates as a multiplier, and wherein the product of the multiplication appears, however, on its output terminal only in the form of an area under square-wave pulses, the values of the amplitudes of which are equal to the values of the input signal of the mark-space modulator 1 and the pulse-gap/pulse duration values of which are those of u'(α). Since u' is only the Mark-Space modulated signal of the input signal of mark-space modulator 1, the input signal is merely another representation of u'. It is amplitude modulated instead of Mark-Space modulated. The area enclosed by the output signal of the pulse amplitude modulator 39 is accordingly proportional to the product [u'·u'(α)] and is converted by the frequency converter 40 into a square wave measurement signal whose frequency is, in turn, proportional to the product [u'·u'(α)] and appears on a a measurement signal output terminal F of the frequency converter 40. If the value of the product is positive, a binary "1" appears on the direction signal output terminal E of the frequency converter 40 instructing forward/backward binary counter 41 to count up. If the value of the product is negative, a binary "0" appears on the direction signal output terminal E instructing forward/backward counter 41 to count down. The forward/backward counter 41 measures the frequency of the measurement signal cumulatively by counting the pulses. It operates thus as an accumulator and eliminates consequently the time-dependent term cos (2ωt+α) by integration. The count, which corresponds to the product ∫U'² cos αdt, is loaded into rate multiplier 21 as the factor (m/n).

Frequency converter 40 is described in U.S. Pat. No. 4,124,821 and the current designations E, F and P' are taken from FIGS. 1 and 5 thereof.

In both versions the clock signal 8 appearing on the clock input terminal 15 of the regulator 4 (FIG. 1) is a square-wave signal of frequency f. The frequency of the output signal of rate multiplier 21 is then f'=(m/n)f. For the case m=1, a programmable divider, for example, MC 14018 B as manufactured by Motorola, may be used in place of the rate multiplier 21. In this case the frequency of the output signal is (f/n).

The output signal of rate multiplier 21, or of the frequency divider, forms the clock signal for delay circuit 2. The delay circuit 2 may, for instance, be a digital shift register such as MC 14006 B. It may also be made up of a random access memory 50 according to FIG. 8.

If the delay circuit 2 includes L memory cells, the phase delay between u'(α) and u' is $(L/f')=(L·n/m·f)$, where L is normally a constant. L can, however, be made variable by reading the output signal u'(α not at the shift register's serial output terminal, but at a terminal of its parallel-out terminal set which may be selected at will by an array of selection switches not shown.

In the feedback circuits 2;4, the value of the ∫U'²cos αdt and therefore also the ratio m:n varies until the time delay (L·n/m·f) of the delay circuit 2 in stable operation reaches a value corresponding to cosα=0, namely α=90°.

In this case the input signal of the first pulse amplitude modulator 3 is phase-shifted 90° with respect to the output signal of the Mark-Space amplitude modulator and the value k·U·I·sinϕ=kQ, neglecting the term sin(2ωt+ϕ) of Equation 1, appears on its output terminal.

The time-voltage converter 18 according to FIG. 3 operates thus: the rising flanks of its input signal are brought into synchronizarion by means of the clock signal 8 appearing on clock input terminal 23 (cf. FIG. 1) and by means of the synchronizing D-flip flop 28 (FIG. 3). Each synchronized rising flank of the input signal resets the binary counter 29 to zero through its reset input terminal R. From this moment on, if the input signal has a binary value of "1", the binary counter 29 counts the pulses of the clock signal 8 forwardly. If the input signal has a binary value of "0", the binary counter 29 counts backwardly instead of forwardly. The difference of these two counts is stored in the intermediate storage register 30 when the next synchronized flank of the input signal rises, and simultaneously the binary counter 29 is reset to zero in preparation for the next counting operation. The time-voltage converter 18 therefore suppresses the Mark-Space modulation by re-converting the Mark-Space values back into amplitude values.

The delay circuit 2 shown in FIG. 8 operates as a shift register as mentioned above. In a first cycle, the write cycle, the binary values of Mark-Space modulated output signal u' of the mark-space modulator 1 are written into the random access memory 50 through the data input terminal 9 by means of the clock signal with a clock frequency (L·n/m·f).

The clock pulses of this clock signal are counted by the binary counter 51 and the binary count value forms the addresses successively, increasing in time of random access memory 50. Thereby a binary "0" or "1" is written into each cell of the random access memory 30, representing the instantaneous value of the scanned Mark-Space modulation signal u'. In a second cycle of operation, the read cycle, the positive-going flank of the clock signal switches single-pole switch 49 to connect the data in-out terminal 54 with the output of delay circuit 2. At the same time, the random access memory 50 is switched by means of its read/write input terminal 53 to the read mode. The stored binary values of the scanned Mark-Space modulated signal u' are now read out of the random access memory 50 phase-shifted as values of signal u'(α), and are fed to the output terminal of the delay circuit 2. At the end of the read cycle, the negative-going flank of the clock signal switches the single pole switch 49 and the read/write input terminal 53 back again to permit a new write cycle, and the new value of u' is written into the random access memory 50 at the same address.

The rate multiplier 21 may, for instance, be type MC 14527 B, the adder 36 MC 14008 B, the random access memory 50 MCM 14537 and the address counter 51 MC 14163 B, as manufactured by Motorola.

The D-flip floprs 28 and 52 may be, for instance, MC 14013B, counters 29 and 41 MC 14516 B, storage registers 30 and 37 MC 14042 B, exclusive or gates 35 and 42 MC 14507 B, and switches 48 and 49 MC 14066 B.

All components MC XXXX B or MCM XXXX are, for instance, integrated circuits such as described in the data manual entitled "The European CMOS Selection" of the Motorola Company of Phoenix, Ariz. These are all conventional components of digital electronic technology with standardized functions and are known to the average expert.

I wish it to be understood that I do not desire to be limited to the exact details of the method or of the construction shown and described, for obvious modifications will occur to a person skilled in the art.

Having thus described the invention, what I claim as new and desired to be secured by Letters Patent is as follows:

1. An apparatus for determining the reactive energy consumption of a circuit
   comprising in combination:
   a mark-space modulator having an input terminal normally accepting a first signal input, and an output terminal;
   pulse amplitude modulating means including one bipolar modulating terminal normally accepting a second and bipolar signal input, a signal output terminal, and a pulse input terminal;
   a delay circuit including a data input terminal connected to the output terminal of said mark-space modulator, an output terminal connected to the pulse input terminal of said pulse amplitude modulating means, and a clock input terminal,
   a phase angle normally occurring between the input terminal and the output terminal of said delay circuit; and regulating means interconnected between said mark-space modulator and said delay circuit so as to maintain said phase angle as closely as possible to 90 degrees, even when said first signal input is subject to level variations and to interference, and wherein said regulating means has an output terminal connected to said clock input terminal of said delay circuit, a clock input terminal for receiving a clock signal, a first signal input terminal connected to the output terminal of said delay circuits, and a second signal input terminal connected to said output terminal of said mark-space modulator, and wherein said regulating means further comprises:

a time-voltage converter having a clock input terminal, a signal input terminal constituting said second input signal terminal of said regulating means, and a bus output terminal;

exclusive or-gate means having a common unipolar input terminal, a bus input terminal, and comprising exclusive or-gates, each exclusive or gate having a first input connected to said common unipolar input terminal, and a second input, said second inputs constituting said bus input terminal, and an output, said outputs constituting a bus output terminal of said exclusive or gate means;

an accumulator having a clock input terminal, a bus input terminal and a bus output terminal; and a rate multiplier having a clock input terminal, a bus input terminal, and an output terminal;

said first signal input terminal of said regulating means being connected to said common unipolar input terminal of said exclusive or-gate means, said second input terminal of said regulating means being connected to said signal input terminal of said time-voltage converter, said clock input terminal of said regulating means being connected to said clock input terminal of said accumulator, to said clock input terminal of said time-voltage converter, and to the clock input terminal of said rate multiplier, said output terminal of said rate multiplier being connected to said output terminal of said regulating means;

a bus connection being established between said bus output terminal of said time voltage converter and said bus input terminal of said exclusive or-gate means;

said bus output terminal of said exclusive or-gate means and said bus input terminal of said accumulator; and said bus output terminal of said accumulator and said bus input terminal of said rate multiplier.

2. The apparatus as claimed in claim 1, wherein said time-voltage converter further includes:

a synchronizing D flip flop having a D-input terminal, a clock input terminal, and a Q output terminal;

a binary counter having a forward/backward count input, a clock input terminal, a reset input terminal, and a bus output terminal;

an intermediate storage register having a clock input terminal, a bus input terminal, and a bus output terminal;

the signal input terminal of said time-voltage converter being connected to the D-input terminal of said synchronizing D-flip flop and to the forward-/backward count input of said binary counter;

the clock input terminal of said time-voltage converter being connected to the clock input terminal of said binary counter, and to the clock input terminal of said synchronizing D-flip flop;

the Q output terminal of said synchronizing D-flip flop being connected to the reset input terminal of said binary counter and to the clock input terminal of said intermediate storage register;

one bus connection being established between said bus output terminal of said binary counter and said bus input terminal of said intermediate storage register, and one bus connection being established between said bus output terminal of said intermediate storage register and said bus output terminal of said time-voltage converter.

3. The apparatus as claimed in claim 1, wherein said accumulator further comprises:

an adder having a first and a second bus input terminal, and a bus output terminal; and an accumulator storage register having a clock input terminal, a bus input terminal, and a bus output terminal;

a connection being established between said bus input terminal of said accumulator; and said first bus input terminal of said adder;

said bus output terminal of said adder, and said bus input terminal of said accumulator storage register;

said bus output terminal of said accumulator storage register and said second bus input terminal of said adder;

said bus output terminal of said accumulator storage register, and said bus output terminal of said accumulator; and the clock input terminal of said accumulator, and the clock input terminal of said accumulator storage register.

4. An apparatus for determining the reactive energy consumption of a circuit comprising in combination:

a mark-space modulator having an input terminal normally accepting a first signal input, and an output terminal;

pulse-amplitude modulating means including one bipolar modulating terminal normally accepting a second and bipolar signal input, a signal output terminal, and a pulse input terminal;

a delay circuit including a data input terminal connected to the output terminal of said mark-space modulator, an output terminal connected to the pulse input terminal of said pulse amplitude modulating means, and a clock input terminal, a phase angle normally occurring between the input terminal and the output terminal of said delay circuit; and regulating means interconnected so as to maintain said phase angle as closely as possible to 90 degrees; even when said first signal input is subject to level variations and to interference, and wherein said regulating means has an output terminal connected to said clock input terminal of said delay circuit, a clock input terminal for receiving a clock signal, a first signal input terminal connected to the output terminal of said delay circuit, and a second signal input terminal connected to said input terminal of said mark-space modulator;

and wherein said regulating means further comprises a filter having an input terminal and a bipolar output terminal;

a second pulse amplitude modulator having a bipolar modulating input terminal, a pulse input terminal, and an output terminal;

a frequency converter having an input terminal, a polarity signal output terminal, a direction signal output terminal, and a measurement signal output terminal;

a forward/backward counter having a clock input terminal, a forward/backward count terminal, and a bus output terminal;

an exclusive or-gate having first and second inputs, and an output; and a rate multiplier having a clock input terminal, an output terminal, and a bus input terminal;

and wherein a connection is established between the first signal input terminal of said regulating means and the first input of the exclusive or-gate of said regulating means;

the output of the exclusive or-gate of said regulator means, and the pulse input terminal of said second pulse amplitude modulator;

the second signal input terminal of said regulating means and the input terminal of said filter;

the output terminal of said pulse amplitude modulator, and the input terminal of said frequency converter;

the bipolar output terminal of said filter, and the bipolar modulating input terminal of said second pulse amplitude modulator;

the polarity signal output terminal of said frequency converter, and the second input of the exclusive or-gate of said regulating means;

the direction signal output terminal of said frequency converter, and the forward backward count terminal of said forward/backward counter;

the measurement signal output terminal of said frequency converter, and the clock input terminal of said forward/backward counter;

the clock input terminal of said regulating means, and the clock input terminal of said forward/backward counter;

the clock input terminal of said regulating means, and the clock input terminal of said rate multiplier;

the output terminal of said rate multiplier, and the output terminal of said regulating means; and the bus output terminal of said forward/backward counter, and said bus input terminal of said rate multiplier.

5. The apparatus as claimed in claim 4, wherein said delay circuit further comprises:

a single pole, double throw switch having a control signal input terminal, a normally closed and openable contact, and a normally open, and closable contact, a random access memory having a read/write input, a data input/output, and an address bus input terminal, and a binary address counter having a clock input terminal, and a parallel bus output terminal, and wherein a connection is established between:

the clock input terminal of said delay circuit, and the clock input terminal of said binary address counter, the clock input terminal of said delay circuit, and the control signal input terminal of said single pole, double throw switch, the clock input terminal of said delay circuit and the read/write input of said random access memory, the data input/output of said random access memory, on one hand, through said normally closed and openable contact, and said data input terminal of said delay circuit, and, on the other hand, through said normally open, and closable contact, and the output terminal of said delay circuit, and the parallel bus output terminal of said address counter and said address bus input terminal of said random access memory.

6. The apparatus as claimed in claim 1, wherein said delay circuit further comprises:

a single pole, double throw switch having a control signal input terminal, a normally closed and openable contact, and a normally open, and closable contact, a random access memory having a read-write input, a data input/output, and an address bus input terminal, and a binary address counter having a clock input terminal, and a parallel bus output terminal, and wherein a connection is established between:

the clock input terminal of said delay circuit, and the clock input terminal of said binary address counter, the clock input terminal of said delay circuit, and the control signal input terminal of said single pole, double throw switch, the clock input terminal of said delay circuit and the read/write input of said random access memory, the data input/output of said random access memory, on one hand, through said normally closed and openable contact, and said data input terminal of said delay circuit, and, on the other hand, through said normally open, and closable contact, and the output terminal of said circuit, and the parallel bus output terminal of said address counter and said address bus input terminal of said random access memory.

* * * * *